United States Patent
Melli et al.

(10) Patent No.: US 11,609,365 B2
(45) Date of Patent: Mar. 21, 2023

(54) FABRICATING NON-UNIFORM DIFFRACTION GRATINGS

(71) Applicant: Magic Leap, Inc., Plantation, FL (US)

(72) Inventors: Mauro Melli, San Leandro, CA (US); Christophe Peroz, San Francisco, CA (US)

(73) Assignee: Magic Leap, Inc., Plantation, FL (US)

( * ) Notice: Subject to any disclaimer, the term of this patent is extended or adjusted under 35 U.S.C. 154(b) by 715 days.

(21) Appl. No.: 16/535,965

(22) Filed: Aug. 8, 2019

(65) Prior Publication Data

US 2019/0369310 A1    Dec. 5, 2019

Related U.S. Application Data

(62) Division of application No. 15/723,851, filed on Oct. 3, 2017, now Pat. No. 10,436,958.

(Continued)

(51) Int. Cl.
*G02B 5/18* (2006.01)
*G02B 6/124* (2006.01)
(Continued)

(52) U.S. Cl.
CPC .......... *G02B 5/1857* (2013.01); *G02B 6/124* (2013.01); *G02B 6/136* (2013.01);
(Continued)

(58) Field of Classification Search
CPC ...... G02B 5/1857; G02B 6/124; G02B 6/136; G02B 27/0172; G02B 6/4205;
(Continued)

(56) References Cited

U.S. PATENT DOCUMENTS

| 5,340,637 A | 8/1994 | Okai et al. |
| 5,668,047 A | 9/1997 | Muroya |

(Continued)

FOREIGN PATENT DOCUMENTS

| CA | 2214927 | 4/1999 |
| CN | 101246229 A | 8/2008 |

(Continued)

OTHER PUBLICATIONS (Bi-Zhen Gond et al. "Design of diffractive phase elements that generate monochromatic or color point and ring patterns," J. Opt. Soc. Am. A, vol. 15 (1998)). (Year: 1998).*

(Continued)

*Primary Examiner* — Thomas K Pham
*Assistant Examiner* — Kuei-Jen L Edenfield
(74) *Attorney, Agent, or Firm* — Fish & Richardson P.C.

(57) ABSTRACT

A method of fabricating non-uniform gratings includes implanting different densities of ions into corresponding areas of a substrate, patterning, e.g., by lithography, a resist layer on the substrate, etching the substrate with the patterned resist layer, and then removing the resist layer from the substrate, leaving the substrate with at least one grating having non-uniform characteristics associated with the different densities of ions implanted in the areas. The method can further include using the substrate having the grating as a mold to fabricate a corresponding grating having corresponding non-uniform characteristics, e.g., by nanoimprint lithography.

20 Claims, 9 Drawing Sheets

Related U.S. Application Data (60) Provisional application No. 62/404,555, filed on Oct. 5, 2016.

(51) Int. Cl.

| | | |
|---|---|---|
| *G02B 6/136* | (2006.01) | |
| *G02B 27/01* | (2006.01) | |
| *G02B 27/42* | (2006.01) | |
| *H01J 37/305* | (2006.01) | |
| *H01J 37/317* | (2006.01) | |
| *G02B 6/12* | (2006.01) | |

(52) U.S. Cl.
CPC ..... *G02B 27/0172* (2013.01); *G02B 27/4205* (2013.01); *G02B 27/4272* (2013.01); *H01J 37/3056* (2013.01); *H01J 37/3171* (2013.01); *G02B 2006/12188* (2013.01); *G02B 2027/0125* (2013.01); *H01J 2237/31708* (2013.01); *H01J 2237/31711* (2013.01)

(58) Field of Classification Search
CPC ........ G02B 6/4272; G02B 2006/12188; G02B 2027/0125; H01J 37/3056; H01J 37/3171; H01J 2237/31708; H01J 2237/31711
USPC ................ 359/569, 563, 566, 571, 573, 575
See application file for complete search history.

(56) References Cited

U.S. PATENT DOCUMENTS

| | | | |
|---|---|---|---|
| 6,381,019 | B1 | 4/2002 | Maris |
| 6,514,674 | B1 | 2/2003 | Iwasaki |
| 8,557,612 | B2 | 10/2013 | Henry et al. |
| 10,436,958 | B2 | 10/2019 | Melli et al. |
| 2005/0128452 | A1 | 6/2005 | Matsumoto |
| 2008/0298744 | A1 | 12/2008 | Wang et al. |
| 2012/0248061 | A1 | 10/2012 | Brown et al. |
| 2013/0215406 | A1 | 8/2013 | Heussler et al. |
| 2014/0093986 | A1 | 4/2014 | Popescu et al. |
| 2014/0252228 | A1 | 9/2014 | McMorran et al. |
| 2016/0276129 | A1 | 9/2016 | Stevens et al. |
| 2017/0031171 | A1* | 2/2017 | Vallius ................ G02B 5/1819 |
| 2017/0131551 | A1* | 5/2017 | Robbins .............. G02F 1/13439 |

FOREIGN PATENT DOCUMENTS

| | | |
|---|---|---|
| JP | H08021906 A | 1/1996 |
| JP | H11295524 A | 10/1999 |
| JP | 2001-345310 A | 12/2001 |
| JP | 2007-109801 A | 4/2007 |
| JP | 4355909 B2 | 11/2009 |
| JP | 2012-222144 A | 11/2012 |
| JP | 2014501937 A | 1/2014 |
| JP | 2014-072500 A | 4/2014 |
| KR | 10-0161389 B1 | 8/1998 |
| KR | 10-2010-0048326 A | 5/2010 |
| KR | 10-2012-0056822 A | 6/2012 |
| WO | WO2003058671 | 7/2003 |
| WO | WO2008081070 | 7/2008 |
| WO | WO2011129814 | 10/2011 |
| WO | 2015/011980 A1 | 1/2015 |
| WO | WO2015184413 | 12/2015 |
| WO | WO2015191104 | 12/2015 |
| WO | WO2016018736 | 2/2016 |

OTHER PUBLICATIONS

B. Schmidt et al., "Etch Rate Retardation of $Ga^+$-Ion Beam-Irradiated Silicon," Journal of The Electrochemical Society, 152 (11) G875-G879 (2005).

H X Qian et al., "Fabrication of Si microstructures using focused ion beam implantation and reactive ion etching," J. Micromech. Microeng. 18, 035003 (2008) (5 pp).

International Search Report and Written Opinion for Application International Application No. PCT/US2017/054844, dated Dec. 7, 2017, 18 pages.

M. Erdmanis et al., "Focused ion beam high resolution grayscale lithography for silicon-based Nanostructures," Appl. Phys. Lett. 104, 073118 (2014) (5 pp).

MD Henry et al., "$Ga^+$beam lithography for nanoscale silicon reactive ion etching," Nanotechnology 21 (2010) 245303 (8 pp).

N. Chekurov et al., "Dry fabrication of microdevices by the combination of focused ion beam and cryogenic deep reactive ion etching," J. Micromech. Microeng. 20, 085009 (2010) (6 pp).

N. Chekurov et al., "The fabrication of silicon nanostructures by local gallium implantation and cryogenic deepreactive ion etching," Nanotechnology 20 (2009) 065307 (5 pp).

Paivi Sievila et al., "The fabrication of silicon nanostructmes by focused-ion-beam implantation and TMAH wet etching," Nanotechnology 21, 145301 (2010) (6 pp).

Z. Han et al., "Selective etching of focused gallium ion beam implanted regions from silicon as a nanofabrication method," Nanotechnology, vol. 26, Jun. 11, 2015, 12 pages.

CN Office Action in Chinese Appln. No. 201780061380.1, dated Jan. 19, 2021, 28 pages (with English translation).

JP Office Action in Japanese Appln. No. 2019-518084, dated Feb. 5, 2021, 13 pages (with English translation).

KR Notice of Allowance in Korean Appln. No. 10-2019-7012944, dated Dec. 24, 2020, 4 pages (with English translation).

JP Notice of Allowance in Japanese Appln. No 2019-518084, dated Oct. 5, 2021, 5 pages (with English translation).

JP Office Action in Japanese Appln. No. 2019-518084, dated Jun. 15, 2021, 8 pages (with English translation).

\* cited by examiner

FABRICATING NON-UNIFORM DIFFRACTION GRATINGS

CROSS-REFERENCE TO RELATED APPLICATION

This application is a divisional of U.S. application Ser. No. 15/723,851, filed on Oct. 3, 2017, which claims the benefit of the filing date of U.S. Provisional Application No. 62/404,555, filed on Oct. 5, 2016. The contents of U.S. Application Nos. 62/404,555 and Ser. No. 15/723,851 are incorporated herein by reference in their entirety.

TECHNICAL FIELD

This disclosure relates generally to micro/nanostructure fabrication, particularly to fabrication of diffraction gratings.

BACKGROUND

Diffraction gratings are optical components with periodic structures that can split and diffract light into several beams travelling into different directions. The directions of these beams depend on the spacing of the grating, the wavelength of the light, and the indexes of refraction both of the grating and of the substrate. In some examples, a diffraction grating is made up of a set of slots with a spacing wider than the wavelength of the light to cause diffraction. After the light interacts with the grating, the diffracted light is composed of the sum of interfering waves emanating from each slot in the grating. Depths of the slots affect the path length of the waves to each slot, which accordingly affect the phases of the waves from each of the slots and thus the diffractive efficiencies of the slots. If the slots have a uniform depth, the slots in the grating may have a uniform diffractive efficiency. If the slots have non-uniform depths, the slots in the grating may have non-uniform diffractive efficiencies.

Diffraction gratings have been fabricated using a variety of methods, including a photo-mask, electron beam lithography, etching techniques, and holographic interference. However, the diffraction gratings fabricated by the above-mentioned method are usually uniform gratings with a uniform diffraction efficiency. There are few methods developed to fabricate diffraction gratings with non-uniform diffraction efficiencies, particularly with a high resolution and a large area.

SUMMARY

One aspect of the present disclosure features a method of fabricating non-uniform structures. The method includes implanting different densities of ions into corresponding areas of a substrate; patterning a resist layer on the substrate; and then etching the substrate with the patterned resist layer, leaving the substrate with at least one non-uniform structure having non-uniform characteristics associated with the different densities of ions implanted in the areas.

The method can include removing the resist layer from the substrate. The method can further include fabricating, by nanoimprint lithography, a corresponding non-uniform structure using the substrate having the non-uniform structure as a mold. Etching the substrate can include using reactive-ion etching.

The non-uniform structure can include a non-uniform grating. In some examples, the grating includes a binary grating with non-uniform depths corresponding to the different densities of ions. In some examples, the grating includes a blazed grating with non-uniform depths corresponding to the different densities of ions.

In some implementations, implanting different densities of ions into corresponding areas of a substrate includes: implanting first densities of ions into at least one target area along a first direction; and implanting second densities of ions into the target area along a second, different direction, wherein an angle between the first direction and second direction is larger than 0 degree and less than 180 degree.

In some implementations, implanting different densities of ions into corresponding areas of the substrate comprises: moving a shutter between an ion source and the substrate along a direction, wherein the implanted areas having the different densities of ions are along the direction. The shutter can be moved according to an ion exposure profile corresponding to the different densities. In some examples, the shutter is a solid panel configured to block ions from passing through.

In some examples, the shutter defines a plurality of through-holes allowing ions to propagate from the ion source to the substrate. In some cases, moving the shutter includes: moving the shutter across a first spot over a first target area in the substrate with a first speed to allow ions pass through the through-holes onto the first target area; moving the shutter from the first spot to a second, sequential spot with a second speed, the second, sequential spot being over a second target area in the substrate, the second speed being faster than the first speed; and moving the shutter across the second, sequential spot with the first speed to allow ions pass through the through-holes onto the second target area. In some cases, moving the shutter includes: moving the shutter to a first spot over a first target area in the substrate; stopping the shutter at the first spot for a period of time to allow an amount of ions pass through the through-holes onto the first target area; and then moving the shutter to a second, sequential spot over a second target area in the substrate.

In some implementations, implanting different densities of ions into corresponding areas of the substrate includes: placing a shutter between an ion source and the substrate, the shutter comprising a plurality of portions with different ion transmittances. The plurality of portions can include a plurality of membranes with different thicknesses corresponding to the different ion transmittances.

In some implementations, implanting different densities of ions into corresponding areas of the substrate includes: using a focused ion beam to locally implant the different densities of ions into the corresponding areas of the substrate.

The resist layer can include photoresist, and patterning the resist layer on the substrate can include: depositing a photoresist layer on the substrate including in the areas; exposing the photoresist layer with patterned light using photolithography; and etching one of the exposed photoresist layer and unexposed photoresist of the deposited photoresist layer to develop the patterned resist layer on the substrate.

Areas without ion implantation can have a first etch sensitivity and areas with ion implantation can have a second etch sensitivity, and a ratio between the first etch sensitivity and the second etch sensitivity can be more than 2. The substrate can be a silicon substrate, and the ions can include Gallium ions. The non-uniform structure can have a lateral resolution of no more than 5000 nm. The non-uniform structure can have an overall size of at least 1 mm.

In some implementations, implanting different densities of ions into corresponding areas of the substrate includes: implanting first different densities of ions into first areas of the substrate along a first direction; and implanting second different densities of ions into second areas of the substrate along a second direction, the second areas being adjacent to the first areas in the substrate. The method can further include removing the resist layer from the substrate leaves the substrate with: a first grating in the first areas, the first grating having increasing diffraction efficiencies along the first direction; and a second grating in the second areas, the second grating having increasing diffraction efficiencies along the second direction. In some cases, implanting different densities of ions into corresponding areas of the substrate includes: implanting third different densities of ions into the first areas along a third direction different from the first direction, wherein an angle between the first direction and the third direction is larger than 0 degree and less than 180 degree, and wherein the third different densities of ions are smaller than the first different densities of ions. In some cases, implanting different densities of ions into corresponding areas of the substrate includes: implanting fourth different densities of ions into the second areas along a fourth direction different from the second direction, wherein an angle between the second direction and the fourth direction is larger than 0 degree and less than 180 degree, and wherein the fourth different densities of ions are smaller than the second different densities of ions.

Another aspect of the present disclosure features a device including a diffraction optical element (DOE) having one or more layers on a substrate, each layer including an orthogonal pupil expansion (OPE) diffraction element and an exit pupil expansion (EPE) diffraction element, wherein the OPE diffraction element comprises a first non-uniform grating configured to deflect part of input light beams propagating in the substrate into the EPE diffraction element in the substrate, and wherein the EPE diffraction element comprises a second non-uniform grating configured to deflect part of the deflected light beams from the OPE diffraction element out of the substrate. The device can include an in-coupling element (ICO) integrated in the substrate and configured to receive the input light beams from outside of the substrate and transmit the input light beams to the DOE in the substrate.

The first non-uniform grating can have a first characteristic that varies along a first direction, and the second non-uniform grating can have a second characteristic that varies along a second direction to the first direction, and the first non-uniform grating can have increasing diffraction efficiencies along the first direction, and the second non-uniform grating can have increasing diffraction efficiencies along the second direction. In some examples, an angle between the first direction and the second direction is between 45 degree and 90 degree.

In some implementations, the first non-uniform grating has a third characteristic that varies along a third direction different from the first direction, and wherein an angle between the first direction and the third direction is larger than 0 degree and less than 180 degree. In some implementations, the second non-uniform grating has a fourth characteristic that varies along a fourth direction different from the second direction, and wherein an angle between the second direction and the fourth direction is larger than 0 degree and less than 180 degree.

The details of one or more disclosed implementations are set forth in the accompanying drawings and the description below. Other features, aspects, and advantages will become apparent from the description, the drawings and the claims.

DETAILED DESCRIPTION

The present disclosure describes methods, apparatus, and systems for micro/nanostructure fabrication, particularly for fabricating non-uniform micro/nanostructures, e.g., diffraction gratings, and applications of the non-uniform micro/nanostructures, e.g., in optical systems. This technology adopts implantation of spatially different densities of ions into corresponding areas of a substrate. The ion implantation can change an etch sensitivity of the substrate, such that the etch sensitivities of the ion-implanted areas and the non-implanted (or non-doped) areas are different. Then, by combining with patterning technology, e.g., lithography or nanoimprinting, to selectively pattern a protective resist layer on the substrate, the technology can make the substrate have different etching depths/heights in the ion-implanted areas and the non-implanted areas, thus to get non-uniform micro/nanostructures. As a result, a gradient or a modulation in ion densities or concentrations in a substrate results in a structure (e.g., grating) with a modulate height/depth profile. Any lithography technology (including any type of photolithography or electron beam lithography) or any type of resist patterning technique can be used here. Furthermore, the substrate with non-uniform structures can be used as a mold, e.g., in nanoimprint lithography, to mass-produce corresponding non-uniform structures with variable heights/depths patterns. The ion implantations can be spatially controlled, e.g., in one-dimension, two-dimensions, or three-dimensions. Also combining the spatially controlled ion implantation with resist patterning (e.g., lithography) and etching, this technology allows more flexibility in design and fabrication of micro/nanostructures than standard lithography or ion implantation technology. This technology can be applied to a substrate with a large area, e.g., more than 1 mm in size, and/or with a high speed, and achieve a high depth resolution, e.g., about 5 to 10 nm, with a large depth range, e.g., from 5 nm to 1000 nm.

This technology can be applied to fabrication of any suitable micro/nanostructures, e.g., grating, with any suitable materials, e.g., silicon, glass or polymer, and any suitable ion spices, e.g., Gallium ions or Argon. For illustration purpose only, the following description is mainly directed to fabricating non-uniform diffraction gratings in a silicon substrate with Gallium ion implantation.

Figure 1:
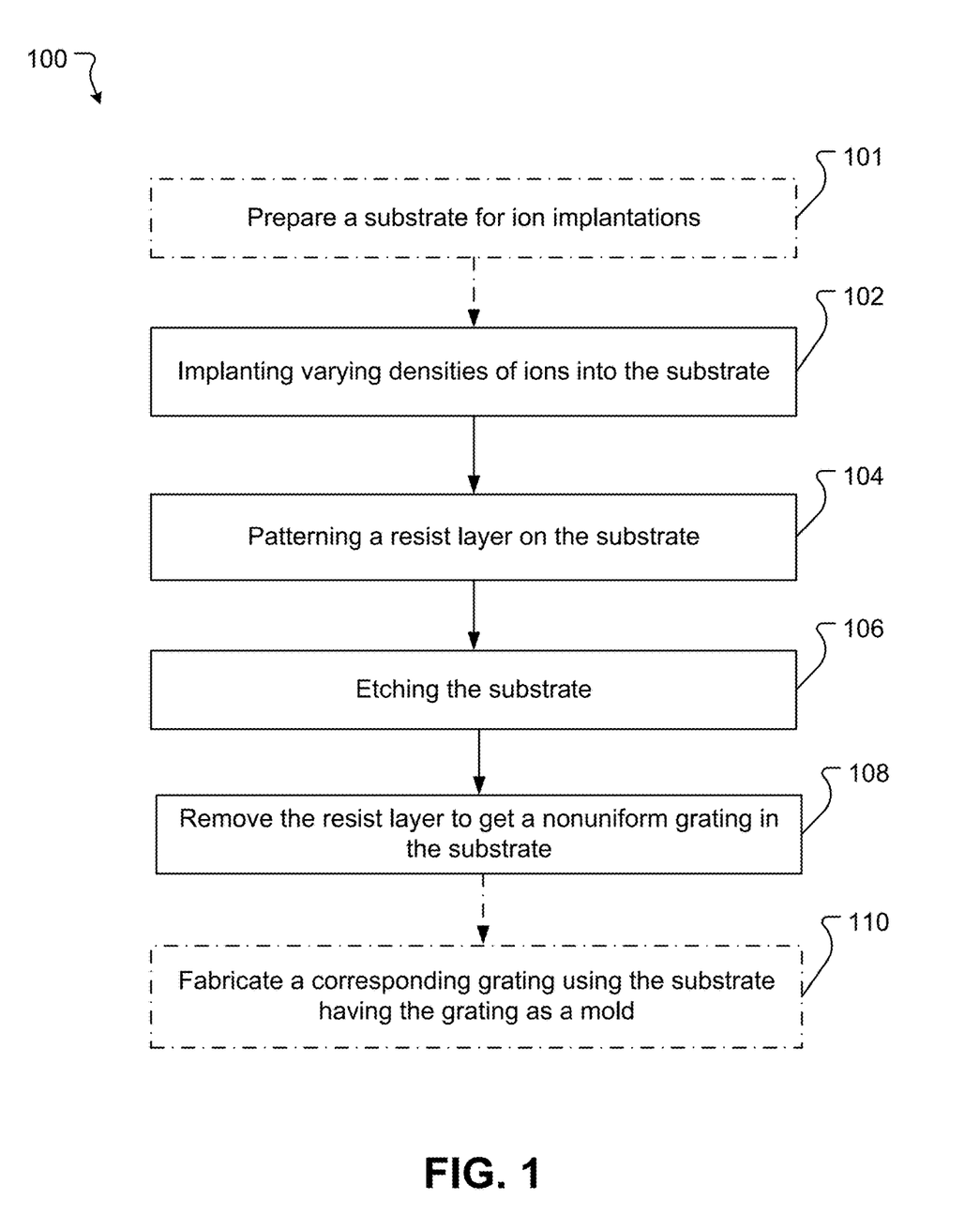
FIG. 1 is a flow diagram of an example process of fabricating a non-uniform diffraction grating in a substrate.
Figure 2:
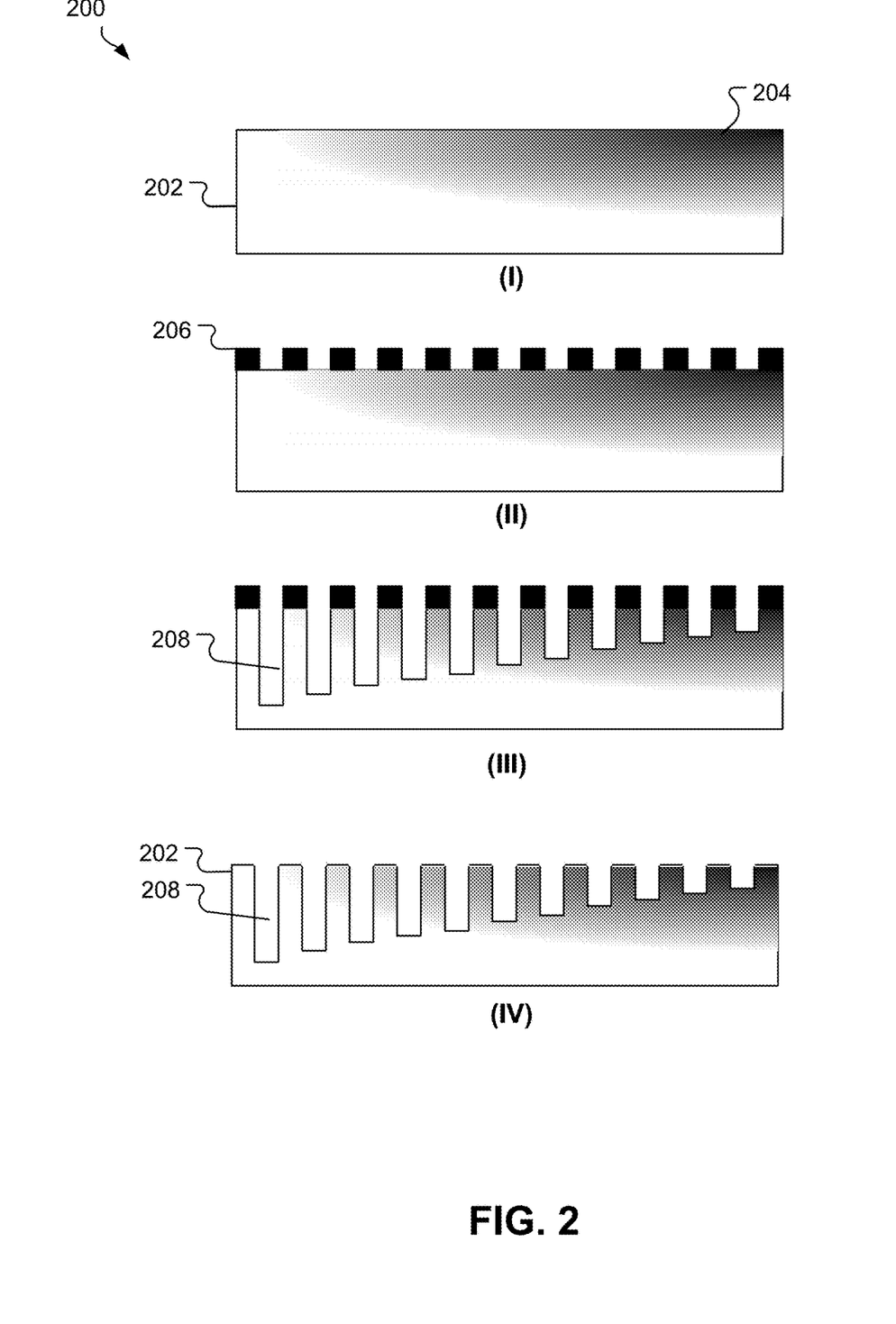
FIG. 2 shows example cross-sectional diagrams of the substrate after different steps of the fabrication process of FIG. 1.

FIG. 1 is a flow diagram of an example process 100 of fabricating a non-uniform diffraction grating in a substrate, and FIG. 2 shows example cross-sectional diagrams 200 of the substrate after different processing steps of the fabrication process 100.

The substrate can be optionally prepared for ion implantations (101). The substrate can be pre-treated, e.g., by cleaning a surface of the substrate. In some cases, wet chemical treatment, e.g., an RCA clean procedure based on solutions, can be used to remove any organic or inorganic contaminations present on the substrate. The solutions can include hydrogen peroxide, trichloroethylene, acetone, or methanol.

The substrate is implanted with varying densities of ions (102). As noted above, the substrate can be a silicon substrate, e.g., a silicon wafer. A size of the silicon wafer can be 2 inches, 4 inches, 6 inches, or any other desired size. The ions can be Gallium ions.

As discussed with further details in FIGS. 3A-3D, the ion implantation can be spatially controlled to locally modulate an ion density in the substrate. Any suitable profile of ion density in the substrate, e.g., linear or sinusoidal, can be achieved. The profile can be one-dimension (e.g., for a linear grating), two-dimensions (e.g., for a circular grating or any two-dimensional nanostructures), or three-dimensions (e.g., for nanostructures with a pyramid shape). (I) in FIG. 2 shows a substrate 202 with a linear profile of ion density 204 after ion implantation, where the ions 204 implanted into the substrate 202 have linearly increasing densities (or depths) from a surface of the substrate 202 along a direction of the substrate 202, e.g., a longitudinal direction. A profile of ion implantation can be pre-determined based on a desired profile of ion density in the substrate. Based on the pre-determined profile of ion implantation, a shutter can be moved, e.g., in one-dimension, two-dimensions, or three-dimensions, with a rate to vary an exposure time of different areas of the substrate to an ion source to achieve the desired profile of ion density in the substrate.

The implanted ions can change the etching sensitivity of the substrate, which may cause etch-retarding behavior (or a masking effect) in etching due to several mechanisms. The first one is a physical modification of implanted areas by impurity atoms, which changes the lattice constant, causes the associated strain effects, and eventually slows down the etching. The second one is a different chemical reaction of ions-implanted and non-implanted areas with etching chemistries. Thus, the etching chemistries can also affect the etching sensitivity of the ion-implanted substrate. In a particular example, a ratio of etch sensitivities (or an etch rate ratio) of non-implanted silicon and Gallium-ion-implanted silicon is more than 1:1, e.g., 2:1, 3:1, 5:1, 10:1, 100:1, or 1000:1.

In some cases, there may exist a maximum exposure dose for ion implantations, below which the final structure height or depth shows a substantially linear dependence with respect to the exposure dose of ion implantations. Beyond the maximum exposure dose, the sputtering of ions may become very extensive and overweight the masking effect. That is, the etch rate ratio may decrease with further increase in ion dose. In a particular example, the maximum exposure dose of Gallium ions for silicon is about $1.5 \times 10^{16}$ ions/cm$^2$.

A resist layer is patterned on the substrate (104). The resist layer can be patterned by any suitable patterning techniques including lithography or nanoimprinting. In some implementations, the resist layer is a photoresist layer and the lithography used is photolithography. The resist layer can be a positive photoresist layer or a negative photoresist layer. The resist layer can be a protective resist layer to protect the substrate under the resist layer from etching.

In some examples, patterning the resist layer on the substrate includes: depositing a photoresist layer on the substrate including the ion-implanted areas, exposing the photoresist layer with patterned light using photolithography, and etching the exposed photoresist layer (e.g., for a positive photoresist layer) or unexposed photoresist (e.g., for a negative photoresist layer) of the deposited photoresist layer to develop the patterned resist layer on the substrate. (II) in FIG. 2 shows the substrate with a patterned protective resist layer 206.

By resist patterning and etching, a pattern profile of the patterned resist layer can be transferred into the substrate. In some examples, a profile of the patterned protective resist layer can be pre-determined or pre-designed based on a profile of a desired grating and a profile of the varying ion density in the substrate. A lateral resolution of the grating can be determined by a resolution of the patterned protective resist layer thus a resolution of the lithography technology. The grating can have a lateral resolution no more than 5,000 nm, particularly less than 1,000 nm, 500 nm, 200 nm, or 100 nm.

The substrate with the patterned resist layer is etched (106). As noted above, the ion implantation changes the etching sensitivity of the substrate, and etching chemistries can also affect the etching sensitivity of the substrate. The substrate can be etched by dry etching, wet-etching, or any suitable etching method. In some examples, the substrate is etched by reactive ion etching (RIE), e.g., RIE at room temperature or deep cryogenic RIE. For example, a silicon substrate with Gallium-ion-implantation can be etched by RIE containing oxygen (e.g., $SF_6/O_2$ plasma), or without oxygen through RIE with fluorine-based chemistry (e.g., $CF_4$).

The etching sensitivity of the substrate varies with varying (or different) densities of ions implanted in corresponding areas of the substrate. With same etching time, the areas with varying (or different) densities of ions can be etched to have varied (or different) depths corresponding to the varying (or different) densities of ions. For example, an area with a higher density of ions has a smaller etching depth than an area with a lower density of ions. The non-implanted area has the highest etching depth. (III) in FIG. 2 shows the substrate with decreasing etching depths 208 from the left to the right, corresponding to increasing densities of ions implanted in the substrate. The substrate with varying etching depths has a pattern corresponding to the patterned protective resist layer on the substrate.

In some cases, an etching depth resolution around 5~10 nm can be achieved. The etching depths can be within a large range, e.g., from 5 nm to 200 nm. The lateral diffusion of the ions during the ion implantation may limit the lateral resolution of a feature size of the fabricated grating, e.g., a grating period. The lateral diffusion depends on the acceleration voltage. In some examples, a diffusion radius is 12 nm for an acceleration voltage of 30 KeV, and 45 nm for an acceleration voltage of 100 KeV.

The resist layer is removed from the substrate to get at least one non-uniform grating (108). After the protective resist layer is no longer needed, it can be removed from the substrate. In some cases, the resist layer is removed by a liquid resist stripper that chemically alters the resist so that the resist no longer adheres to the substrate. In some cases, the resist layer is removed by a plasma containing oxygen.

The non-uniform grating can have a profile associated with the varying densities of ions in the areas. As an example, (IV) in FIG. 2 shows a diffraction grating having linearly varying depths 208 along a direction of the grating. The depths correspond to the varying densities of ions along the direction, and the grating can have a varying diffraction efficiency along the direction. In some examples, the non-uniform grating is a binary grating, as illustrated by (IV) in FIG. 2, with non-uniform depths corresponding to the varying densities of ions.

In some examples, the non-uniform grating is a blazed grating with non-uniform depths corresponding to the varying densities of ions. For example, a saw-tooth profile in the ion exposure dose can result in a blazed profile after etching. The structure can be patterned with the following concept: the top blaze part receives a maximum dose, and the modulation of a blaze angle is performed by varying a slope of the dose gradient within each period.

Optionally, the substrate having the non-uniform grating can be used as a mold for fabricating a corresponding grating (110), e.g., by nanoimprint lithography including thermoplastic nanoimprint lithography, photo nanoimprint lithography, or resist-free direct thermal nanoimprint lithography. This step can mass produce the corresponding grating on a new substrate. The new substrate can include silicon, glass, or polymer.

The description above is an example process that fabricates non-uniform diffraction gratings. The process uses varying density of ion implantation to achieve different etching sensitivity in a substrate to thus get non-uniform diffraction gratings. The disclosed process can be adapted to fabricate any non-uniform micro/nanostructures in a substrate. For example, in some implementations, in step 106 of FIG. 1, the substrate is etched to have at least one non-uniform structure having non-uniform characteristics associated with different densities of ions implanted in the areas. The remaining resist layer can be kept on the substrate, e.g., as a protective layer or a layer having other functionalities, for the formed non-uniform structure in the substrate. In some examples, the resist layer is deposited substantially uniformly on the substrate by chemical vapor deposition (CVD), e.g., metal organic chemical vapor deposition (MOCVD). In some examples, additional layers may be further deposited on the substrate and the resist layer.

FIGS. 3A-3D show different example methods of implanting varying densities of ions into a substrate, which can be performed in step 102 of the process 100 of FIG. 1.

Figure 3A:
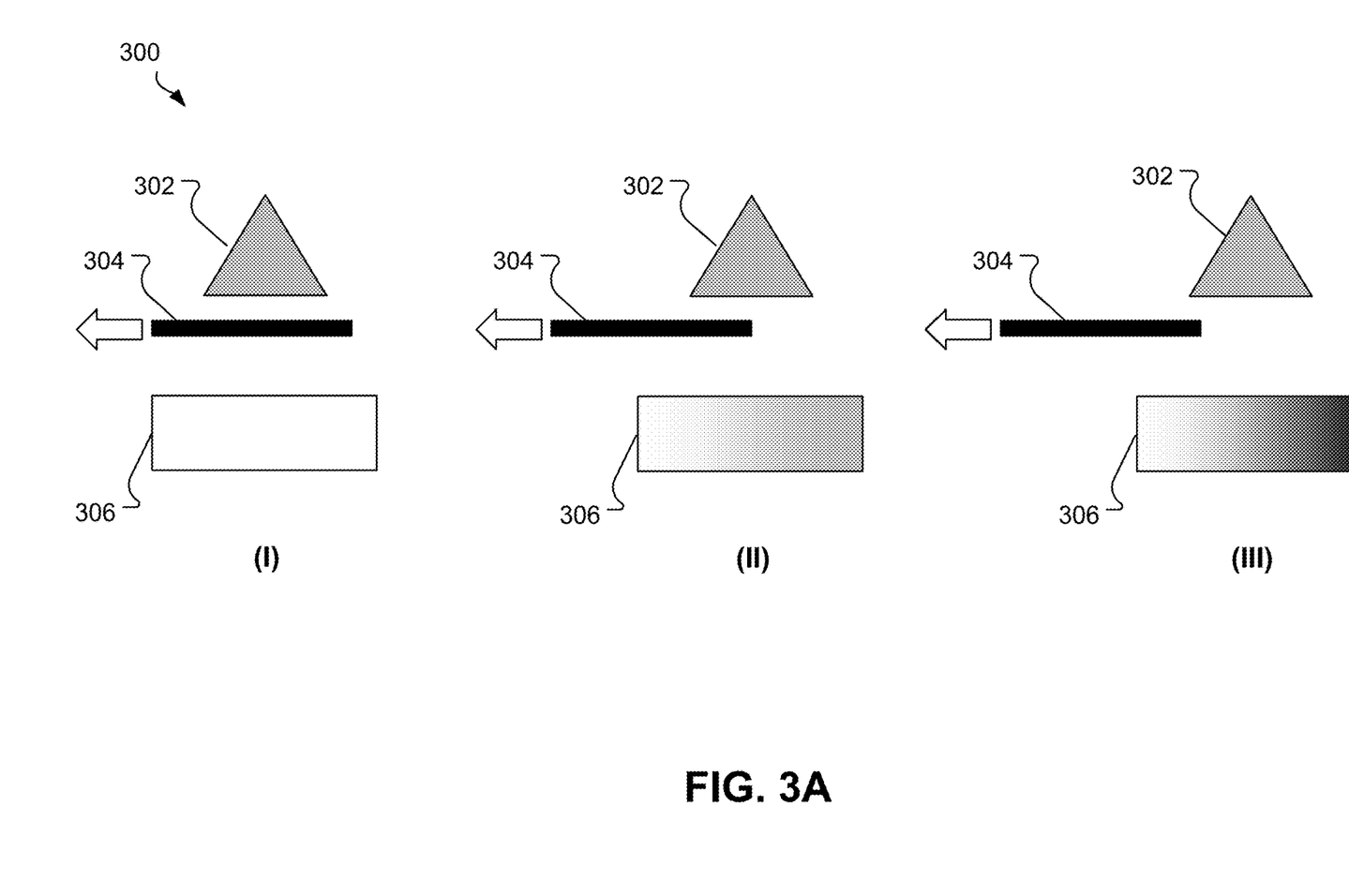
FIG. 3A is a schematic diagram of a first example method of implanting varying densities of ions into a substrate using a moving shutter with a solid panel.

Referring to FIG. 3A, a first example method 300 uses a moving shutter with a solid panel 304 to move between an ion source 302 and a substrate 306 to change exposure doses for different parts of the substrate 306. The shutter 304 is configured to totally block ions to go through. For example, the shutter 304 can be made of a solid panel, e.g., steel. The shutter 304 is controlled or motorized to move.

Diagrams (I), (II), and (III) in FIG. 3A schematically show the ion source 302, the moving shutter 304, and the substrate 306 at different time slots. Diagram (I) in FIG. 3A shows, before the ion implantation, the moving shutter 304 is positioned between the ion source 302 and the substrate 306 to totally block ions propagate from the ion source 302 to the substrate 306. Then, as shown in Diagram (II) in FIG. 3A, when the moving shutter 304 is moved, e.g., along a direction such as from right to left, the substrate 306 starts to receive ions irradiation from the ion source 302. The right part of the substrate 306 experiences longer ion exposure dose than the left part of the substrate, thus the right part of the substrate has a higher density of ions implanted in the substrate. The substrate 306 thus has varying densities of ions along the direction. The shutter 304 can be moved based on a profile, e.g., a predetermined profile based on a desired profile of ion density in the substrate. Diagram (III) in FIG. 3a shows that, when the moving shutter 304 is moved out of the space between the ion source 302 and the substrate 306, the substrate 306 has varying densities of ions along the direction, for example, an increasing ion density from left to right with an increasing ion exposure dose. In some cases, the substrate 306 is further exposed to the ion source 302 without the moving shutter 304 there between until a desired profile of ion density is achieved across the substrate.

Figure 3B:
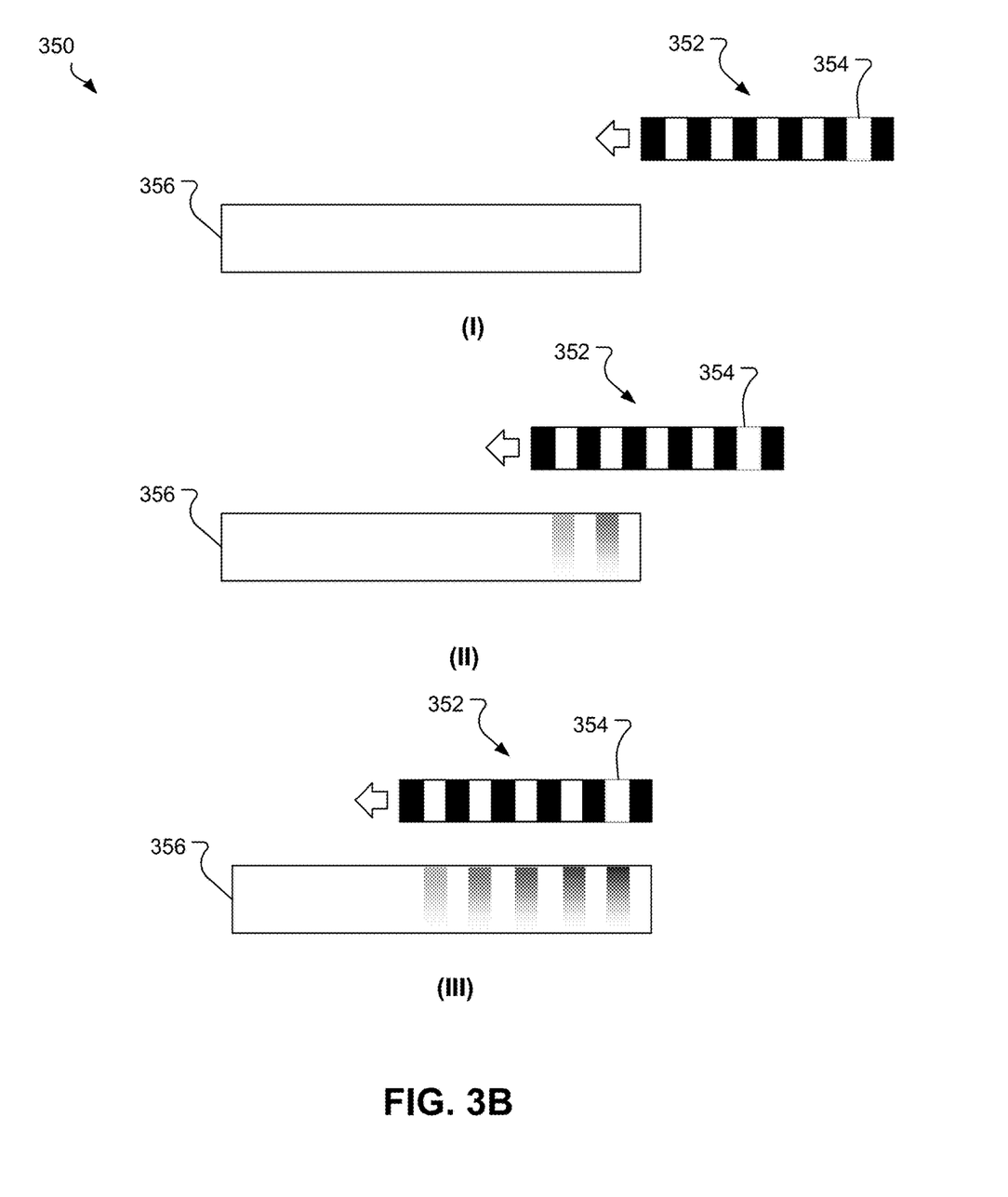
FIG. 3B is a schematic diagram of a second example method of implanting varying densities of ions into a substrate using a moving shutter with through-holes.

FIG. 3B is a schematic diagram of a second example method 350 of implanting varying densities of ions into a substrate using a moving shutter 352 with through-holes 354. The through-holes 354 allow ions from an ion source (not shown here) to go through and hit on a substrate 356. The other part of the moving shutter 352 can be made of a solid material such as steel to block the ions from passing through. Properties of the through-holes 354 in the moving shutter 352, e.g., a width and/or a period, can be determined based on a desired profile of a structure, e.g., a grating.

Diagrams (I), (II), and (III) in FIG. 3B schematically show the moving shutter 352 and the substrate 356 at different time slots. It shows that when the moving shutter 352 moves along a direction from right to left, an area exposed with a higher dose has a higher ion density. In some implementations, the shutter 352 constantly moves along the direction. When the shutter 352 moves across a first spot corresponding to a first target area to be ion implanted, the shutter 352 can move with a slower speed, so that an amount of ions can pass through the through-holes 354 to the first target area. When the shutter moves from the first spot to a second, sequential spot corresponding to a second target area to be ion implanted, the shutter can move with a faster speed, e.g., the speed can be fast enough to ignore the ion exposure on the substrate when moving between the two spots. When the shutter moves across the second spot, the speed of the shutter is adjusted from the faster speed to the slower speed. In some implementations, the shutter 352 moves discretely along the direction. When the shutter 352 moves to the first spot, the shutter 352 stops to allow a certain amount of ions passing through the through-holes 354 to the first target area. Then the shutter 352 moves to the second spot and stops for ion implantations on the second target area. In some cases, the ion sources are shut off when the shutter 352 moves between the two spots. In some cases, the shutter 352 moves with a fast speed between the two spots, and the ion sources remain on.

Compared to the substrate 306 of FIG. 3A having varying densities of ions across the substrate 306, the substrate 356 has a patterned profile of ion implantation across the substrate 356. That is, the ions are periodically implanted into the substrate with varying densities along the direction. In some cases, the substrate 356 with the patterned and varying ion implantations can be directly etched without using additional patterning technology to get a grating with varying depths/heights. In some cases, the substrate 356 can also be etched by combing with patterning technology, e.g., lithography technology, to create any desired etching pattern. In some implementations, a length of the moving shutter 352 is smaller than a length of the substrate 356, as illustrated in FIG. 3B. In some implementations, a length of the moving shutter 352 is larger than or identical to a length of the substrate 356. The moving shutter 352 can be positioned to completely cover the substrate 356 at an initial position and then moved discretely to allow different portions of the substrate 356 have different exposure times of ion implantations.

Figure 3C:
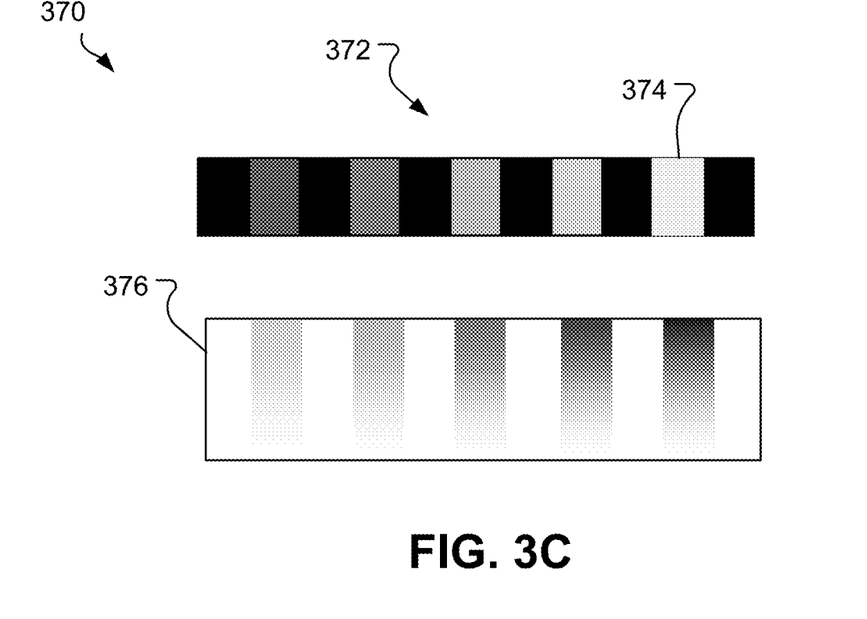
FIG. 3C is a schematic diagram of a third example method of implanting varying densities of ions into a substrate using a shutter having portions with varying transmissions.

FIG. 3C is a schematic diagram of a third example method 370 of implanting varying densities of ions into a substrate 376 using a shutter 372 having portions 374 with varying transmissions. Note that the shutter 372 can be statically positioned (or moved) between an ion source (not shown here) and the substrate 376. The portions 374 can have varying transmissions in the shutter 372 which can allow different percentages of ions propagating through. In some implementations, the portions 374 are made of membranes, e.g., silicon membranes, with different thicknesses corresponding to different ion transmittances.

In a particular example, the shutter 372 is configured to have five portions with a series of transmittance, e.g., varying from 10%, 30%, 50%, 70%, to 90% (from left to right) in FIG. 3C. The rest of the shutter 372 has a transmittance of 0%, that is, totally blocking ions go through. In such a way, with a same exposure time, different areas of the substrate can experience different ion exposure doses thus have different densities of ions. As a result, the substrate 376 can also have patterned ion implantations with varying densities across the substrate, similar to FIG. 3B. The substrate 376 can also be etched with or without lithography technology.

The methods illustrated in FIGS. 3A-3C can be performed by a standard ion implantation system with different types of shutters, which can enable large implantation areas, e.g., larger than 1 mm in size, with high speeds.

Figure 3D:
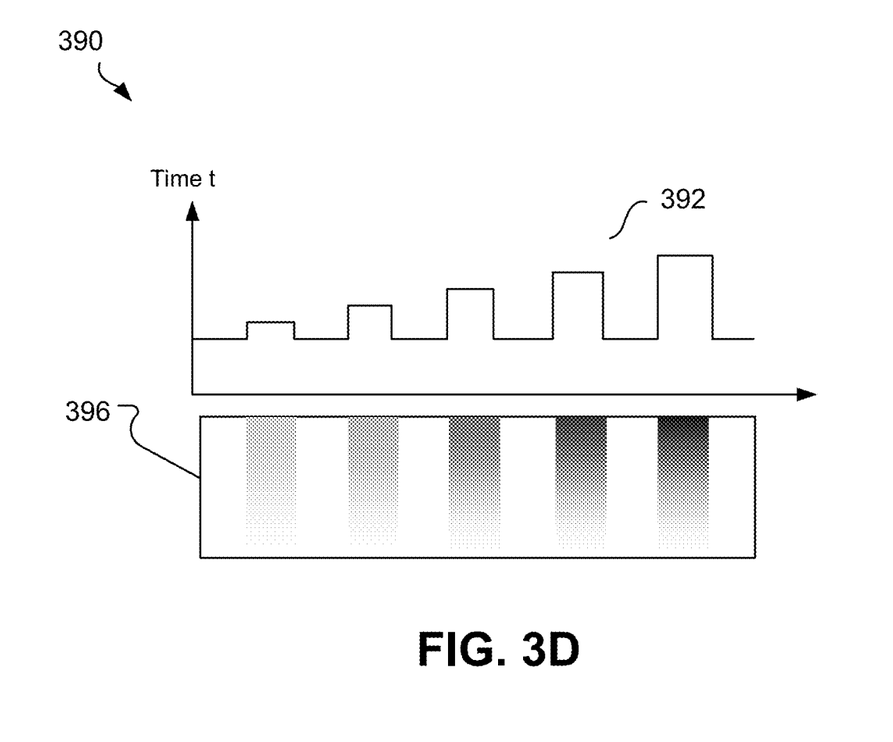
FIG. 3D is a schematic diagram of a fourth example method of implanting varying densities of ions into a substrate using focused ion beam (FIB).

FIG. 3D is a schematic diagram of a fourth example method 390 of implanting varying densities of ions into a substrate using a focused ion beam (FIB). Curve 392 shows a profile of FIB exposure dose that can be determined by a desired profile of ion density in the substrate 396. The FIB method enables to achieve a high resolution, although it may be challenging to pattern a large area, e.g., more than 1 mm in size.

The description above shows example methods to implant varying densities of ions into a substrate. Other methods can be also used to achieve this. For illustration purpose only, FIGS. 3A-3D show varying densities of ions implanted in a substrate along one dimension. It is noted that the methods can be applied to achieve varying densities of ions implanted in two dimensions, with any desired profile, e.g., linear, sinusoidal, or circular.

Example Experimental Results

Figure 4A:
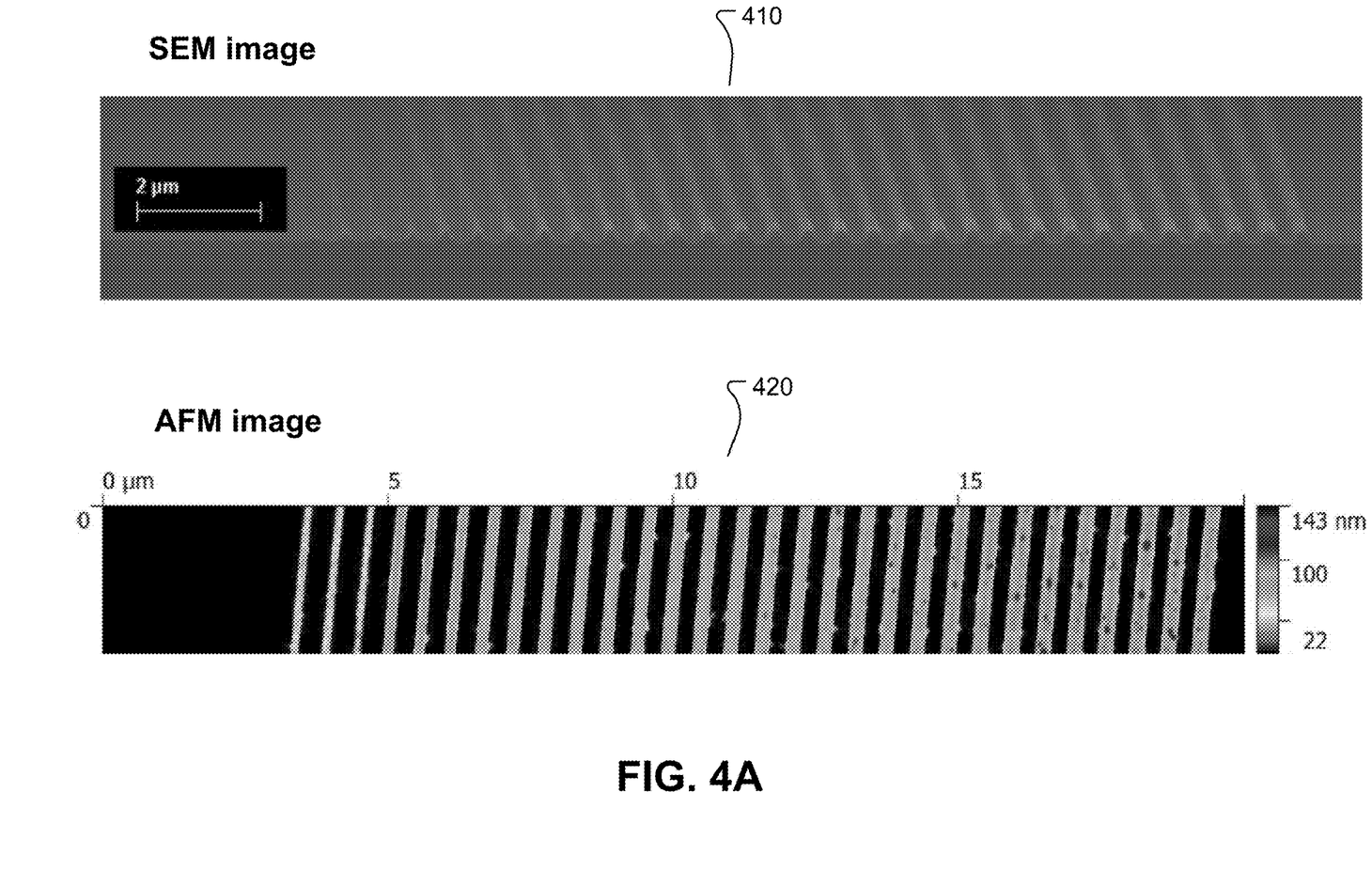
FIG. 4A shows experimental results of a small area non-uniform ion implantation and etching into silicon substrate.

FIG. 4A shows experimental results of a small area non-uniform diffraction grating fabricated with Gallium ion implantation in a silicon substrate. Focused ion beam (FIB) is first used to locally implant Gallium ions into the silicon substrate with 10 different doses (linearly varying from $10^{15}$ to $10^{16}$ ions/cm$^2$) into 10 lines (with 100 nm width and 50 µm long). Then the substrate is etched based on $SF_6/O_2$ cryogenic process. Diagram 410 shows the scanning electron microscope (SEM) image of the fabricated grating, and diagram 420 shows the corresponding atomic force microscope (AFM) image of the fabricated grating. The grating has a height variation ranging from 60 to 90 nm.

Figure 4B:
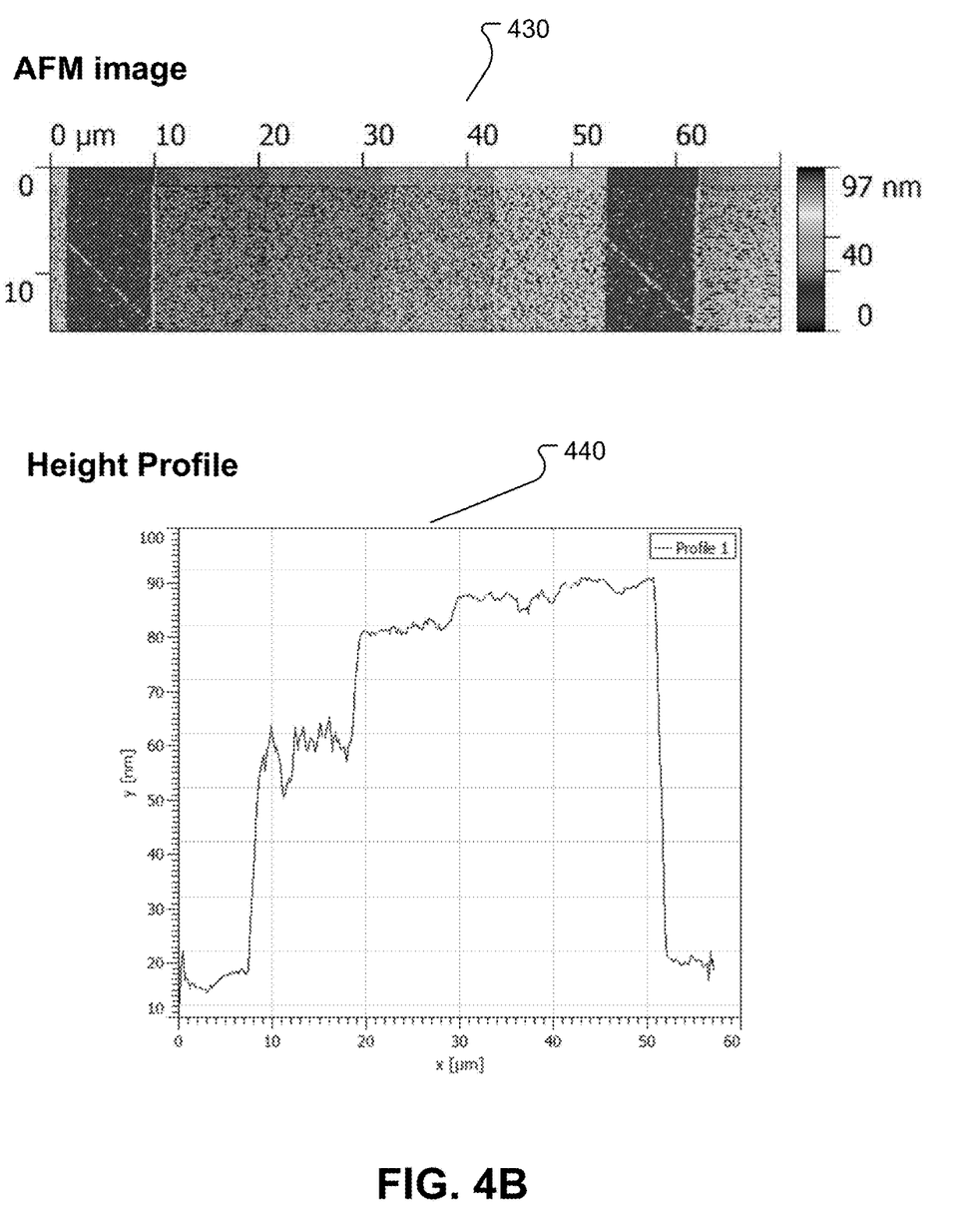
FIG. 4B shows experimental results of a large area with non-uniform ion implantation and etching into silicon substrate.

Compared to FIG. 4A, FIG. 4B shows experimental results of a large area non-uniform diffraction grating fabricated with Gallium ion implantation in a silicon substrate using the same FIB and etching method. Diagram 430 shows an AFM image of the fabricated grating where different ion doses are implanted in 10-micron wide bands, while diagram 440 shows a corresponding height profile of the fabricated grating.

Figure 5:
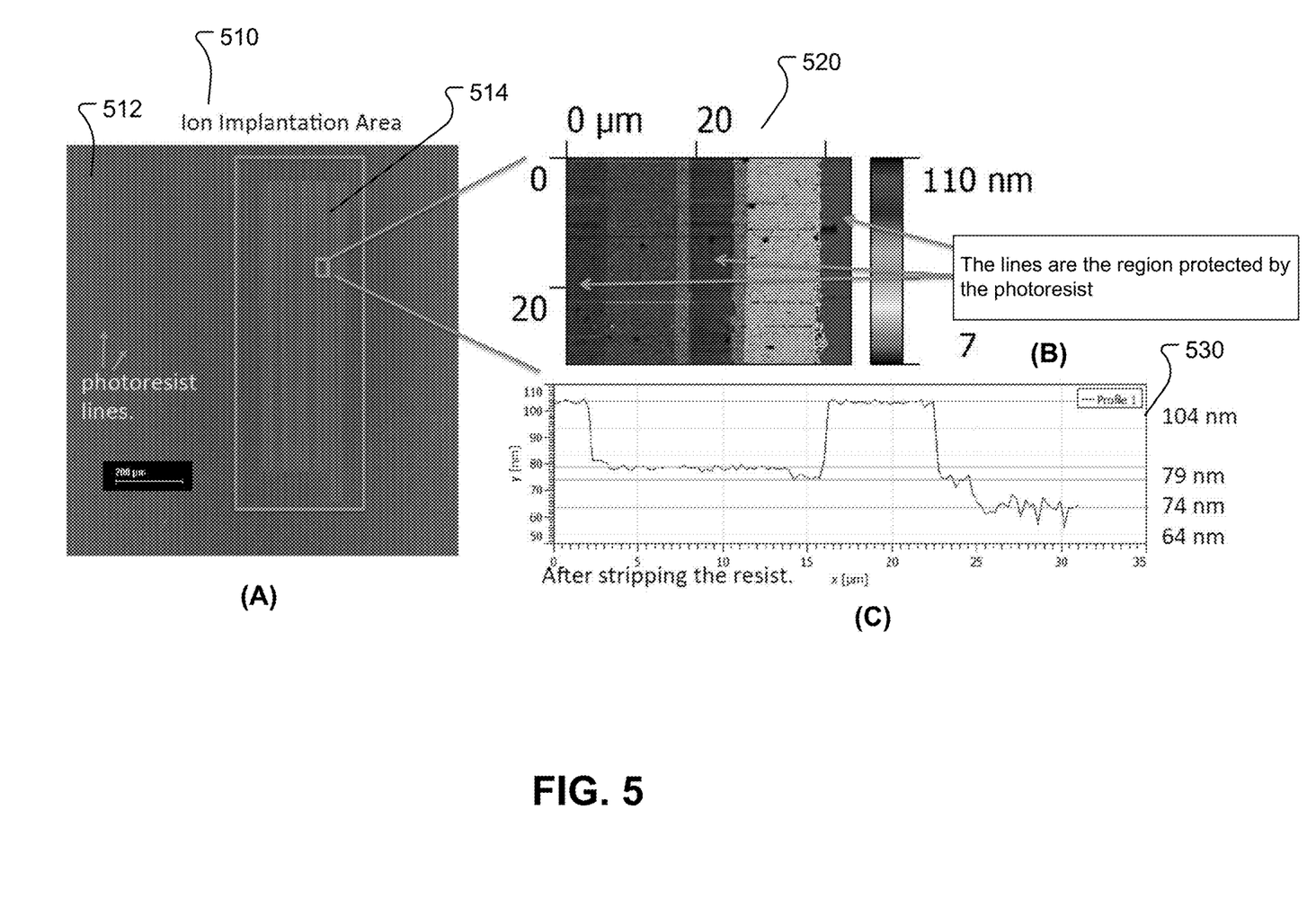
FIG. 5 shows experimental results of a non-uniform diffractive grating fabricated with ion implantation and lithography according to an example embodiment.

FIG. 5 shows experimental results of a non-uniform diffraction grating fabricated with ion implantation according to an example embodiment. Compared to FIGS. 4A and 4B, the diffraction grating is fabricated by combining FIB ion implantation, optical lithography patterning, and etching together.

First, the substrate 510 is modified by FIB to implant varying densities of ions into different portions of an area 514 of the substrate 510. Then the substrate 510 is patterned with a protective photoresist layer by photolithography. (A) in FIG. 5 shows an SEM image of the substrate after patterning, which includes the photoresist lines 512 and the ion implantation area. The photoresist lines 512 have a width of 5 micron. Finally, the substrate 510 is etched and the protective photoresist layer is removed. (B) in FIG. 5 shows an AFM image 520 of the fabricated grating having different depths, while (C) in FIG. 5 shows corresponding height profile 530 of the fabricate grating. The experimental results show the feasibility of combining ion implantations with lithography and etching technology to make diffraction gratings with various depths.

Example Systems

Figure 6:
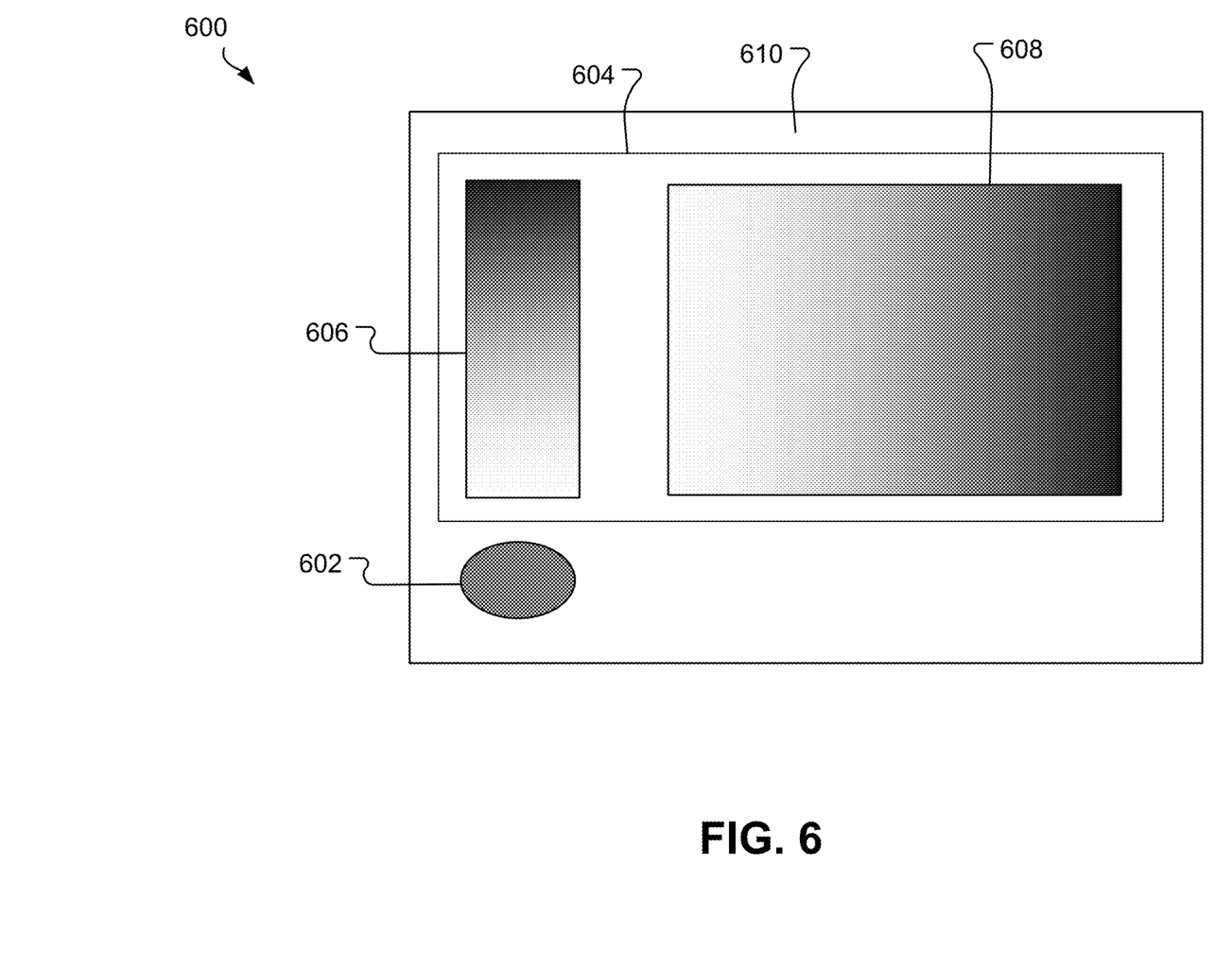
FIG. 6 shows an example optical system using non-uniform diffraction gratings.

FIG. 6 shows an example optical system 600 using non-uniform diffraction gratings. The optical system 600 can be used for virtual and augmented reality applications. In some implementations, the optical system 600 has an eyepiece including an in-coupling optic (ICO) element 602 and a diffractive optical element (DOE) 604. The eyepiece can be implemented as described in a U.S. patent application Ser. No. 14/726,424, entitled "Methods and systems for generating virtual content display with a virtual or augmented reality apparatus" and filed on May 29, 2015 herewith, whose content is hereby incorporated by reference in its entirety.

The ICO 602 and DOE 604 can be implemented in a substrate 610. The substrate 610 can be transparent, e.g., glass. The DOE 604 can have one or more layers, and each layer can include an orthogonal pupil expansion (OPE) diffractive element 606 and an exit pupil expansion (EPE) diffractive element 608.

The ICO element 602 is configured to receive input light beams, e.g., from a projector, and transmit the input light beams to the DOE 604 in the substrate 610. For example, the substrate 610 includes a waveguide (not shown here), the ICO element 602 transmits the input light beams into the waveguide that is coupled to the DOE 604. The input light beams travels in the waveguide by total internal reflection (TIR). The OPE diffractive element 606 on a layer is configured to deflect some of the input light beams to the EPE diffractive element 608 that is configured to in turn deflect some of the deflected light beams out of the substrate 610, e.g., toward a user's eye(s).

The OPE diffractive element 606 and the EPE diffractive element 608 can be arranged in co-planar or side-by-side on the same layer. To get light beams out of the substrate, the DOE 604 is configured to diffract the light beams across the DOE 604, e.g., with selective distributions of diffraction. In some embodiments, the distribution of diffracted light is substantially uniform. In some embodiments, the amount of diffracted light is variable across a profile of the DOE 604, e.g., in an increasing gradient or randomized fashion. For example, as the intensity of the light beams decreases when the light beams propagate in the DOE 604 and are gradually deflected by the OPE diffractive element 606 and the EPE diffractive element 608, the diffraction efficiency of the DOE 604 can be configured to gradually increase along the propagation path of the light beams.

In some implementations, the OPE diffractive element 606 includes a first non-uniform grating positioned along a first direction, e.g., from bottom to top, as shown in FIG. 6. The EPE diffractive element 608 includes a second non-uniform grating positioned along a second direction, e.g., from left to right, as shown in FIG. 6. An angle between the first direction and the second direction can be within a range of 0 to 90 degree. In some cases, the angle is between 45 degree and 90 degree. In some cases, the angle is between 80 degree and 90 degree. In a particular example, the second direction is perpendicular to the first direction. The first non-uniform grating can be a diffraction grating with linearly varying depths along the first direction, thus the first non-uniform grating can have a gradually increasing diffraction efficiency along the first direction. The second non-uniform grating can be a diffraction grating with linearly varying depths along the second direction, thus the second non-uniform grating can have a gradually increasing diffraction efficiency along the second direction.

In some implementations, the OPE diffractive element 606 and the EPE diffractive element 608 include linear diffractive structures, circular diffractive structures, radially symmetric diffractive structures, or any combination thereof. The OPE diffractive element 606 and the EPE diffractive element 608 can include both the linear grating structures and the circular or radially symmetric diffractive elements to both deflect and focus light beams.

The first and second non-uniform gratings can be fabricated by a process similar to the process 300 of FIG. 3. The process starts with implanting first varying densities of ions into first areas of a substrate, e.g., the substrate 610 along a first direction and implanting second varying densities of ions into second areas of the substrate along a second direction, the second areas being adjacent to the first areas in the substrate. A shutter, e.g., the shutter 204 of FIG. 2A, can be moved in two-dimensions to implement the ion implantations into the first and second areas. Then a protective resist layer is deposited on the substrate and patterned, e.g., by photolithography. The process continues with etching the substrate having the patterned protective resist layer to develop varying depths in the first areas and the second areas. Finally, the patterned protective resist layer is removed and the substrate having the first non-uniform grating in the first areas and the second non-uniform grating in the second areas is obtained. The first non-uniform grating has non-uniform depths along the first direction and thus non-uniform diffraction efficiencies along the first direction. The second non-uniform grating has non-uniform depths along the second direction and thus non-uniform diffraction efficiencies along the second direction. In some implementations, the substrate having the first and second non-uniform gratings is used as a mask to massively produce corresponding non-uniform gratings in other substrates by nanoimprint lithography.

In some implementations, the DOE 604 includes at least one dithering feature along its diffractive structure, e.g., along the first non-uniform grating of the OPE diffractive element 606 and/or the second non-uniform grating of the EPE diffractive element 608. For example, a dithering feature along the first non-uniform grating can be achieved by performing an additional ion implantation along a third direction different from the first direction along which the first areas in the substrate are ion implanted. The additional ion implantation can be less than the previous ion implantations on the first areas. An angle between these first and third directions can be larger than 0 degree and less than 180 degree, e.g., 90 degree. A dithering feature along the second non-uniform grating can be achieved by performing an additional ion implantation along a fourth direction different from the second direction along which the second areas in the substrate are ion implanted. The additional ion implantation can be less than the previous ion implantations on the second areas. An angle between these second and fourth directions can be larger than 0 degree and less than 180 degree, e.g., 90 degree.

The description above is an example system that includes non-uniform diffraction gratings. The system adopts diffraction gratings with non-uniform diffraction efficiencies along a light propagation path such that uniform diffracted light can be achieved when light prorogates and is gradually deflected along the path. The disclosed implementations can be adopted to any system that requires varying diffraction efficiencies.

A number of implementations have been described. Nevertheless, it will be understood that various modifications may be made without departing from the spirit and scope of the techniques and devices described herein. Features shown in each of the implementations may be used independently or in combination with one another. Additional features and variations may be included in the implementations as well. Accordingly, other implementations are within the scope of the following claims.

What is claimed is:

1. A device comprising:
a diffractive optical element (DOE) having one or more layers on at least partially in a substrate, each layer including an orthogonal pupil expansion (OPE) diffractive element and an exit pupil expansion (EPE) diffractive element,
wherein the OPE diffractive element comprises a first non-uniform grating configured to deflect part of input light beams propagating in the substrate into the EPE diffractive element in the substrate,
wherein the EPE diffractive element comprises a second non-uniform grating configured to deflect part of deflected light beams from the OPE diffractive element out of the substrate, and
wherein the first non-uniform grating has a first characteristic that varies along a first direction, and the first non-uniform grating has increasing diffraction efficiencies along the first direction associated with the first characteristic that corresponds to linearly varying densities of ions implanted in a medium of the substrate along the first direction.

2. The device of claim 1, wherein the second non-uniform grating has a second characteristic that varies along a second direction different from the first direction, and the second non-uniform grating has increasing diffraction efficiencies along the second direction.

3. The device of claim 2, wherein an angle between the first direction and the second direction is between 45 degrees and 90 degrees.

4. The device of claim 2, wherein the first non-uniform grating has a third characteristic that varies along a third direction different from the first direction, and wherein an angle between the first direction and the third direction is larger than 0 degree and less than 180 degrees.

5. The device of claim 2, wherein the second non-uniform grating has a fourth characteristic that varies along a fourth direction different from the second direction, and wherein an angle between the second direction and the fourth direction is larger than 0 degree and less than 180 degrees.

6. The device of claim 2, further comprising an in-coupling element (ICO) integrated in the substrate and configured to receive the input light beams from outside of the substrate and transmit the input light beams to the DOE in the substrate.

7. The device of claim 2, wherein the first non-uniform grating has first linearly varying depths along the first direction, and the second non-uniform grating has second linearly varying depths along the second direction.

8. The device of claim 1, wherein at least one of the first non-uniform grating or the second non-uniform grating comprises a binary grating with non-uniform depths.

9. The device of claim 1, wherein at least one of the first non-uniform grating or the second non-uniform grating comprises a blazed grating with non-uniform depths.

10. The device of claim 1, wherein at least one of the first non-uniform grating or the second non-uniform grating comprises at least one of a linear diffractive structure, a circular diffractive structure, or a radially symmetric diffractive structure.

11. The device of claim 1, wherein at least one of the first non-uniform grating or the second non-uniform grating has a lateral resolution of no more than 5000 nm.

12. The device of claim 1, wherein at least one of the first non-uniform grating or the second non-uniform grating has an area with a dimension of at least 1 mm.

13. The device of claim 1, wherein the OPE diffractive element and the EPE diffractive element are arranged as co-planar or side-by-side on each layer of the one or more layers.

14. The device of claim 1, wherein the DOE comprises at least one dithering feature along at least one of the first non-uniform grating or the second non-uniform grating.

15. The device of claim 1, wherein the DOE is configured to deflect the input light beams out across an area of the DOE with a substantially uniform diffraction efficiency.

16. A device comprising:
a substrate; and
a non-uniform grating formed at least partially in the substrate, the non-uniform grating having a first characteristic that varies along a first direction, wherein the non-uniform grating has increasing diffraction efficiencies along the first direction associated with the first characteristic that corresponds to linearly varying densities of ions implanted in a medium of the substrate along the first direction.

17. The device of claim 16, wherein the non-uniform grating has a second characteristic that varies along a second direction different from the first direction, and
wherein an angle between the first direction and the second direction is larger than 0 degree and less than 180 degrees.

18. The device of claim 16, wherein the non-uniform grating has linearly varying depths along the first direction.

19. The device of claim 16, wherein the first characteristic comprises a series of grooves along the first direction, and wherein varying densities of ions implanted in the substrate are between adjacent grooves along the first direction.

20. The device of claim 16, wherein the first characteristic comprises a series of grooves along the first direction, and wherein varying densities of ions implanted in the substrate are under the series of grooves along the first direction.

* * * * *